United States Patent
Matsunaga et al.

(10) Patent No.: US 8,956,462 B2
(45) Date of Patent: Feb. 17, 2015

(54) TREATMENT LIQUID FOR INHIBITING PATTERN COLLAPSE IN MICROSTRUCTURE AND METHOD OF MANUFACTURING MICROSTRUCTURE USING THE SAME

(71) Applicant: Mitsubishi Gas Chemical Company, Inc., Chiyoda-ku (JP)

(72) Inventors: Hiroshi Matsunaga, Tokyo (JP); Kimihiro Aoyama, Tokyo (JP)

(73) Assignee: Mitsubishi Gas Chemical Company, Inc., Chiyoda-ku (JP)

( * ) Notice: Subject to any disclaimer, the term of this patent is extended or adjusted under 35 U.S.C. 154(b) by 52 days.

(21) Appl. No.: 13/799,522

(22) Filed: Mar. 13, 2013

(65) Prior Publication Data

US 2013/0260571 A1   Oct. 3, 2013

(30) Foreign Application Priority Data

Mar. 27, 2012 (JP) .................. 2012-071080
Feb. 12, 2013 (JP) .................. 2013-024629

(51) Int. Cl.
| C11D 3/36 | (2006.01) |
| C11D 3/43 | (2006.01) |
| C11D 7/36 | (2006.01) |
| H01L 21/02 | (2006.01) |
| H01L 21/06 | (2006.01) |
| C09D 7/12 | (2006.01) |
| H01L 21/033 | (2006.01) |
| H01L 21/311 | (2006.01) |

(52) U.S. Cl.
CPC .......... *C09D 7/1233* (2013.01); *H01L 21/0337* (2013.01); *H01L 21/02068* (2013.01); *H01L 21/31111* (2013.01)

USPC ............. 134/2; 510/175; 510/176; 510/436; 510/467; 510/505

(58) Field of Classification Search
CPC ...... C11D 3/2006; C11D 3/2068; C11D 3/36; C11D 3/43; C11D 7/263; C11D 7/36; H01L 21/02; H01L 21/06
USPC ............ 510/175, 176, 436, 467, 505; 134/2
See application file for complete search history.

(56) References Cited

U.S. PATENT DOCUMENTS

| 2012/0174945 A1* | 7/2012 | Saio et al. .................. 134/4 |
| 2013/0280123 A1* | 10/2013 | Chen et al. .................. 422/1 |

FOREIGN PATENT DOCUMENTS

| JP | 2004-184648 | 7/2004 |
| JP | 2005-309260 | 11/2005 |
| JP | 2006-163314 | 6/2006 |
| JP | 2010-114467 | 5/2010 |
| JP | 2012-9802 | 1/2012 |
| JP | 2012-33890 | 2/2012 |

* cited by examiner

*Primary Examiner* — Brian P Mruk
(74) *Attorney, Agent, or Firm* — Oblon, Spivak, McClelland, Maier & Neustadt, L.L.P.

(57) ABSTRACT

The objects of the present invention are to provide a treatment liquid able to inhibit pattern collapse in a microstructure such as a semiconductor device or a micromachine, as well as a method of manufacturing a microstructure using the same.
Means to solve the problems is to treat a microstructure with a treatment liquid for inhibiting pattern collapse in a metal microstructure comprising an alkylphosphonic acid or salt thereof in which said alkyl moiety contains 6 to 18 carbon atoms, water, and a water soluble solvent.

11 Claims, 1 Drawing Sheet

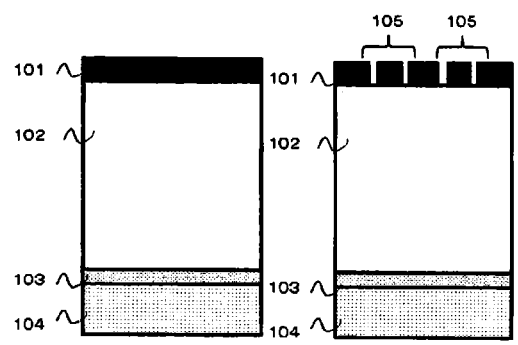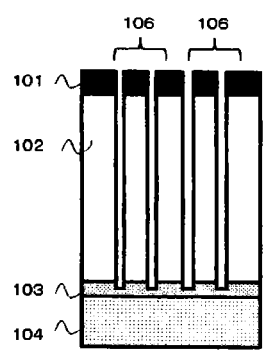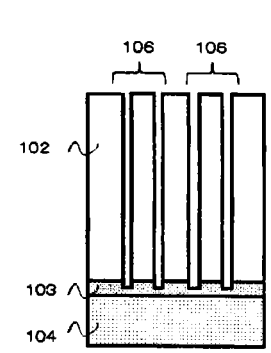
Fig. 1A    Fig. 1B    Fig. 1C    Fig. 1D
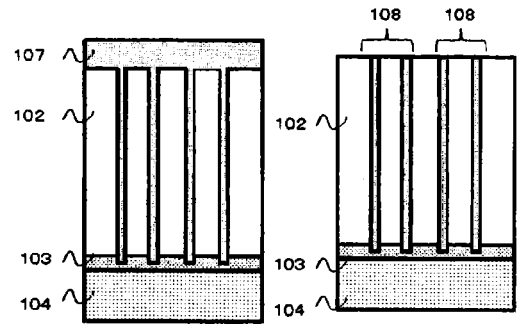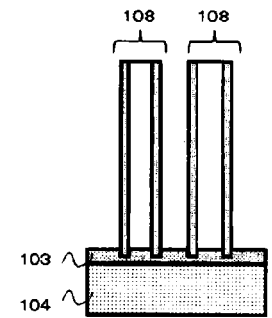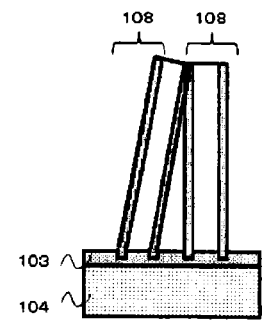
Fig. 1E    Fig. 1F    Fig. 1G    Fig. 1H

TREATMENT LIQUID FOR INHIBITING PATTERN COLLAPSE IN MICROSTRUCTURE AND METHOD OF MANUFACTURING MICROSTRUCTURE USING THE SAME

TECHNICAL FIELD

The present invention relates to a treatment liquid for inhibiting pattern collapse in a microstructure and a method of manufacturing a microstructure using the same.

BACKGROUND ART

Usually, photolithographic technique has been used as a method of forming/processing a device having a microstructure such as a semiconductor device or a circuit board used in a wide range of technical fields. Accompanied by the sophistication of required performance, in these fields, the miniaturization, high-density integration and speed-up of a semiconductor device and the like are significantly advanced, and a resist pattern used for photolithography is miniaturized, and aspect ratio of the resist pattern keeps increasing. Accompanied by the advance of such miniaturization, however, collapse of the resist pattern becomes a major problem.

It has been known that collapse of a resist pattern is caused by action of stress due to surface tension of a treatment liquid, upon drying the resist pattern to remove the treatment liquid used in wet treatment (which intends to mainly a rinsing treatment for washing away a developing solution) following a development of the resist pattern. For the resolution of collapse of a resist pattern, such methods have been proposed as a method of replacing a rinsing liquid by a liquid with low surface tension comprising a nonionic surfactant, a compound soluble in an alcohol solvent or the like and then drying (see, for example, Patent Literatures 1 and 2), and a method of having a surface of resist pattern hydrophobic (see, for example, Patent Literature 3).

Here, in a microstructure comprising metal, metal nitride, metal oxide, silicon oxide, silicon or the like which is formed by photolithography technique (except a resist; the same hereinafter, unless otherwise indicated), the strength of material in itself of which the structure is formed is larger than the strength of a resist pattern in itself or the bonding strength between a resist pattern and a substrate. Therefore, the structure pattern is hard to collapse as compared to the resist pattern. However, accompanied by the advance of miniaturization, high-density integration or speed-up of a semiconductor device, a micromachine or the like, the collapse of structure pattern due to the miniaturization of structure pattern and an increase of aspect ratio becomes a major problem.

There, for the resolution of collapse of a microstructure pattern, a method of forming a water repellent protective film using a surfactant has been proposed (see, for example, Patent Literature 4). However there is no specific description about kind (for example, nonionic, anionic or cationic), a product name, the content or the like of the surfactant at all.

Further, a method of forming a water repellent protective film onto a rough pattern surface on a surface of wafer comprising metal material in part by using a variety of non-water soluble surfactants has been proposed (see, for example, Patent Literature 5). However, for using a treatment liquid for inhibiting pattern collapse comprising the non-water soluble surfactant, an organic solvent, a mixture of the said organic solvent and an aqueous rinsing liquid, and a rinsing liquid mixing those with at least one of acid and alkali are required as pre-treatment liquids. Thus, the number of processes for forming the protective film is a lot and complicated, so it is desired to lessen the number of such processes.

Furthermore, a method of forming a water repellent protective film onto a rough pattern surface on a surface of wafer comprising metal material by using a treatment liquid for inhibiting pattern collapse comprising an alkylamine and water has been proposed (see, for example, Patent Literature 6). However, as for a pattern with high aspect ratio, pattern collapse cannot be inhibited (see Comparative Examples 8, 17 and 26 as described hereinbelow).

[Patent Literature 1] JP 2004-184648A
[Patent Literature 2] JP 2005-309260A
[Patent Literature 3] JP 2006-163314A
[Patent Literature 4] JP 2010-114467A
[Patent Literature 5] JP 2012-9802A
[Patent Literature 6] JP 2012-33890A

DISCLOSURE OF THE INVENTION

Problems to be Solved by the Invention

As described above, no effective technique to inhibit collapse of pattern with high aspect ratio in few processes is known in the field of a microstructure comprising metal, metal nitride, metal oxide or the like, such as a semiconductor device or a micromachine.

The present invention has been made under such situation, and objects thereof are to provide a treatment liquid able to inhibit collapse of pattern with high aspect ratio in a microstructure such as a semiconductor device or a micromachine, as well as a method of manufacturing a microstructure using the same.

Means to Solve the Problems

We, the present inventors, have conducted diligent research to achieve the aforementioned objects, and as a result we have found that we can achieve the objects by a treatment liquid comprising an alkylphosphonic acid or salt thereof in which said alkyl moiety contains 6 to 18 carbon atoms, water, and a water soluble solvent.

The present invention has been accomplished based on such findings. That is, the gist of the present invention is as follows.

1. A treatment liquid for inhibiting pattern collapse in a metal microstructure comprising an alkylphosphonic acid or salt thereof in which said alkyl moiety contains 6 to 18 carbon atoms; water; and a glycol of the following formula (1) or (2):

    $$HO(C_2H_4O)_nR^1 \quad (1)$$

    $$HO(C_3H_6O)_mR^1 \quad (2)$$

wherein $R^1$ denotes a hydrogen atom or a $C_1$-$C_4$ alkyl group, n denotes an integer of 2 to 4, and m denotes an integer of 1 to 3.

2. The treatment liquid for inhibiting pattern collapse according to the above item 1, wherein the microstructure contains at least one metal selected from among titanium, tantalum and aluminum.

3. The treatment liquid for inhibiting pattern collapse according to the above item 1, wherein the content of the alkylphosphonic acid is 0.1 ppm to 10,000 ppm.

4. The treatment liquid for inhibiting pattern collapse according to the above item 1, wherein the content of the alkylphosphonic acid is 0.5 ppm to 1,000 ppm.

5. The treatment liquid for inhibiting pattern collapse according to the above item 1, wherein the content of the alkylphosphonic acid is 5 ppm to 800 ppm.
6. The treatment liquid for inhibiting pattern collapse according to the above item 1, wherein the content of the glycol is 60% by weight to 99% by weight.
7. A method of manufacturing a microstructure containing at least one metal selected from among titanium, tantalum and aluminum, the method comprising:
in rinsing steps following wet-etching or dry-etching, using a treatment liquid for inhibiting pattern collapse in a metal microstructure comprising an alkylphosphonic acid or salt thereof in which said alkyl moiety contains 6 to 18 carbon atoms; water; and a glycol of the following formula (1) or (2):

$$HO(C_2H_4O)_nR^1 \qquad (1)$$

$$HO(C_3H_6O)_mR^1 \qquad (2)$$

wherein $R^1$ denotes a hydrogen atom or a $C_1$-$C_4$ alkyl group, n denotes an integer of 2 to 4, and m denotes an integer of 1 to 3.
8. The method of manufacturing a microstructure according to the above item 7, wherein the microstructure containing at least one metal selected from among titanium, tantalum and aluminum is a semiconductor device or a micromachine.

Effects of the Invention

The present invention can provide a treatment liquid able to inhibit pattern collapse in a microstructure comprising at least one metal selected from among titanium, tantalum and aluminum, such as a semiconductor device or a micromachine, as well as a method of manufacturing a microstructure using the same.

BRIEF DESCRIPTION OF THE DRAWINGS

[FIG. 1] FIG. 1A to FIG. 1H include schematic cross-section views of a microstructure at each of manufacturing steps.

EMBODIMENTS TO CARRY OUT THE INVENTION

The treatment liquid of the present invention is used for inhibiting pattern collapse in a microstructure and comprises an alkylphosphonic acid or salt thereof in which said alkyl moiety contains 6 to 18 carbon atoms; water; and a water-soluble solvent, in particular, a glycol.

The alkylphosphonic acid in which said alkyl moiety contains 6 to 18 carbon atoms used in the treatment liquid of the present invention is deemed to be adsorbed onto material used for pattern of a microstructure and to have surface of the pattern hydrophobic. The hydrophobic referred herein indicates that contact angle between the material treated with the treatment liquid of the present invention and water becomes 65° or more, preferably 70° or more.

An alkyl moiety of the alkylphosphonic acid in which said alkyl moiety contains 6 to 18 carbon atoms used in the treatment liquid of the present invention may contain a halogen atom and may be linear, branched or cyclic, is preferably linear. The compound having linear alkyl moiety can be densely adsorbed on metal material compared with the compound having branched alkyl moiety.

The alkylphosphonic acid in which said alkyl moiety contains 6 to 18 carbon atoms includes, for example, n-hexylphosphonic acid, n-heptylphosphonic acid, n-octylphosphonic acid, n-nonylphosphonic acid, n-decylphosphonic acid, n-undecylphosphonic acid, n-dodecylphosphonic acid, n-tridecylphosphonic acid, n-tetradecylphosphonic acid, n-pentadecylphosphonic acid, n-hexadecylphosphonic acid, n-heptadecylphosphonic acid, n-octadecylphosphonic acid and the like; preferably n-hexylphosphonic acid, n-octylphosphonic acid, n-decylphosphonic acid, n-dodecylphosphonic acid, n-tetradecylphosphonic acid, n-hexadecylphosphonic acid and n-octadecylphosphonic acid; and more preferably n-octylphosphonic acid, n-decylphosphonic acid, n-dodecylphosphonic acid, n-tetradecylphosphonic acid and n-hexadecylphosphonic acid.

The salt of alkylphosphonic acid can be either normal salt or acid salt. The class of salt includes salt of metal ion such as sodium, potassium or lithium; salt of amine such as ammonia, ethanolamine, diethanolamine, triethanolamine, methylamine, dimethylamine, trimethylamine, ethylamine, diethylamine, triethylamine, methylethanolamine, dimethylethanolamine, methyldiethanolamine, ethylethanolamine, diethylethanolamine or ethyldiethanolamine; and salt of ammonium ion such as tetramethylammonium, tetraethylammonium, tetrabutylammonium or 2-hydroxyethyl-N,N,N-trimethylammonium. Particularly preferred are salts of potassium, ammonia, tetramethylammonium and 2-hydroxyethyl-N,N,N-trimethylammonium.

The content of alkylphosphonic acid in the treatment liquid of the present invention is preferably 0.1 ppm to 10,000 ppm, more preferably 0.5 ppm to 1,000 ppm, and particularly 5 ppm to 800 ppm. The content of alkylphosphonic acid within the aforementioned range has adequate effects.

The water-soluble solvent includes a glycol, more preferably solvent of the following general formula (1) or general formula (2):

$$HO(C_2H_4O)_nR^1 \qquad (1)$$

$$HO(C_3H_6O)_mR^1 \qquad (2)$$

wherein $R^1$ denotes a hydrogen atom or a $C_1$-$C_4$ alkyl group such as methyl group, ethyl group, n-propyl group, iso-propyl group, n-butyl group, iso-butyl group, sec-butyl group or tert-butyl group; n denotes an integer of 2 to 4; and m denotes an integer of 1 to 3. The solvents of the general formula (1) or general formula (2) include, for example, diethylene glycol, diethylene glycol monomethyl ether, diethylene glycol monoethyl ether, diethylene glycol monopropyl ether, diethylene glycol monobutyl ether, triethylene glycol, triethylene glycol monomethyl ether, triethylene glycol monoethyl ether, triethylene glycol monopropyl ether, triethylene glycol monobutyl ether, tetraethylene glycol, tetraethylene glycol monomethyl ether, tetraethylene glycol monoethyl ether, tetraethylene glycol monopropyl ether, tetraethylene glycol monobutyl ether, propylene glycol, propylene glycol monomethyl ether, propylene glycol monoethyl ether, propylene glycol monopropyl ether, propylene glycol monobutyl ether, dipropylene glycol, dipropylene glycol monomethyl ether, dipropylene glycol monoethyl ether, dipropylene glycol monopropyl ether, dipropylene glycol monobutyl ether, tripropylene glycol, tripropylene glycol monomethyl ether, tripropylene glycol monoethyl ether, tripropylene glycol monopropyl ether and tripropylene glycol monobutyl ether. The preferred solvent is diethylene glycol, diethylene glycol monomethyl ether, diethylene glycol monoethyl ether, diethylene glycol monobutyl ether, triethylene glycol, triethylene glycol monomethyl ether, triethylene glycol monoethyl ether, triethylene glycol monobutyl ether, propylene glycol, propylene glycol monoethyl ether, dipropylene glycol, dipropylene glycol monomethyl ether or tripropylene glycol.

The content of glycol of general formula (1) or (2) in the treatment liquid of the present invention is preferably 60 to 99% by weight, more preferably 60 to 95 by weight, and particularly 70 to 90% by weight. Two or more glycols can be mixed at an arbitrary ratio. The content of glycol within the aforementioned range has adequate effects, but if the content is less than the aforementioned range, it is hard to solve alkylphosphonic acid. If an object to be treated is treated with such treatment liquid, particles remain on the object to be treated, result in troubles. If the content is in excess of the aforementioned range, removal of alkylphosphonic acid by glycol becomes more predominant than adsorption of alkylphosphonic acid onto the material, so the property of hydrophobic decreases.

Water used is preferably water from which metal ion, organic impurities, particles and the like have been removed by distillation, ion-exchange process, filtration, various adsorption processes and the like, particularly preferred are pure water and extra-pure water.

The treatment liquid of the present invention adequately inhibits pattern collapse in a microstructure such as a semiconductor device and a micromachine. Here, pattern of a microstructure includes preferably material comprising at least one metal selected from among titanium, tantalum and aluminum. The material comprising titanium includes titanium, titanium nitride, titanium oxide and the like, the material comprising tantalum includes tantalum, tantalum nitride, tantalum oxide and the like, and the material comprising aluminum includes aluminum, aluminum oxide and the like.

The microstructure may be patterned on an insulating film species, such as a TEOS (tetraethyl orthosilcate oxide film) or a SiOC low-dielectric film (Applied Materials, Inc., Black Diamond 2 (trade name), ASM International N.V., Aurora 2.7 or Aurora 2.4 (trade name)), or may contain an insulating film species as a part of the microstructure.

The treatment liquid of the present invention can exhibit excellent pattern collapse inhibiting effects to not only ordinary microstructures, but also microstructures with further miniaturization and higher aspect ratio. The aspect ratio referred herein is a value calculated from (height of pattern/width of pattern), and the treatment liquid of the present invention can exhibit excellent pattern collapse inhibiting effects to a pattern that has a high aspect ratio of 5 or more, and further 9 or more. Further the treatment liquid of the present invention has excellent pattern collapse inhibiting effects to a fine pattern with a pattern size of 300 nm or less, 150 nm or less, and 100 nm or less, and even with a pattern size of 50 nm or less and a line/space ratio of 1/1. Similarly it has excellent effects to a fine pattern having a cylinder hollow or cylinder solid structure of which patterns distance is 300 nm or less, 150 nm or less, 100 nm or less, and further 50 nm or less. The method of manufacturing a microstructure is characterized in that the aforementioned treatment liquid of the present invention is used in rinsing steps following wet-etching or dry-etching. More specifically, in the said rinsing steps, the pattern of microstructure is preferably contacted with the treatment liquid of the present invention by dipping, spray ejecting, spraying or the like, and then is dried after the said treatment liquid is replaced by water. Here, in case where the pattern of microstructure is contacted with the treatment liquid of the present invention by dipping, the dipping time is preferably from 10 seconds to 30 minutes, more preferably from 15 seconds to 20 minutes, further preferably from 20 seconds to 15 minutes, and particularly preferably from 30 seconds to 10 minutes, and the temperature condition is preferably from 10 to 90° C., more preferably from 25 to 80° C., further preferably from 25 to 70° C. Further, the pattern of microstructure can be rinsed with water prior to contacting it with the treatment liquid of the present invention. As seen above, the pattern of microstructure is contacted with the treatment liquid of the present invention to have surface of the pattern hydrophobic and thereby collapse of the pattern can be inhibited.

The treatment liquid of the present invention may be widely applied to a manufacturing process of a microstructure irrespective of the kind of the microstructure, as far as the manufacturing process has a step of wet-etching or dry-etching, then a step of wet treatment (such as etching, cleaning or rinsing for washing the cleaning liquid), and then a drying step. For example, the treatment liquid of the present invention may be favorably used after an etching step in a manufacturing process of a semiconductor device or a micromachine, such as, (i) after wet-etching of an insulating film around an electroconductive film in the production of a DRAM type semiconductor device (see, for example, JP 2000-196038A and JP 2004-288710A), (ii) after a rinsing step for removing contaminants formed in dry-etching or wet-etching upon processing a gate electrode in the production of a semiconductor device having a transistor with a fin in the form of strips (see, for example, JP 2007-335892A), and (iii) after a rinsing step for removing contaminants formed in etching for forming a cavity by removing a sacrifice layer comprising an insulating film via a through hole in an electroconductive film upon forming a cavity of a micromachine (electrodynamic micromachine) (see, for example, JP 2009-122031A).

EXAMPLES

The invention will be illustrated in more detail with reference to the following Examples, but it should be understood that the present invention is not deemed to be limited thereto.

<Preparation of Treatment Liquids>

The treatment liquids for inhibiting pattern collapse in a microstructure were prepared according to formulations shown in Table 1. The deficit of the content up to 100% by weight was compensated by supplying water.

TABLE 1

| Treatment Liquid No. | Alkyl-phosphonic acid reagent | Content (ppm) | Glycol Solvent | Content (%) | Glycol Solvent | Content (%) |
|---|---|---|---|---|---|---|
| 1 | HPA | 5000 | DEG | 95 | — | — |
| 2 | HPA | 50 | PG | 65 | — | — |
| 3 | OPA | 5 | PG | 60 | — | — |
| 4 | OPA•NH$_3$ | 800 | DEGM | 90 | — | — |
| 5 | DPA | 5 | DPG | 60 | — | — |
| 6 | DPA•2K | 1000 | TEG | 80 | PG | 15 |
| 7 | DDPA•2K | 50 | TEG | 80 | — | — |
| 8 | DDPA•TMA | 500 | DEGB | 85 | — | — |
| 9 | DDPA•HTMA | 1000 | DEGE | 95 | — | — |
| 10 | DDPA | 30 | DPG | 40 | DEGM | 40 |
| 11 | TDPA | 100 | TEGB | 80 | — | — |
| 12 | TDPA | 3 | TPG | 70 | — | — |
| 13 | TDPA | 900 | DPG | 90 | — | — |
| 14 | TDPA | 30 | DPG | 45 | DEGE | 35 |
| 15 | TDPA•NH$_3$ | 100 | DEG | 70 | TEG | 10 |
| 16 | HDPA | 1 | PGE | 85 | — | — |
| 17 | HDPA | 800 | DPGM | 95 | — | — |
| 18 | HDPA•TMA | 5 | TEGM | 85 | — | — |

TABLE 1-continued

| Treatment Liquid No. | Alkyl-phosphonic acid reagent | Content (ppm) | Glycol Solvent | Content (%) | Glycol Solvent | Content (%) |
|---|---|---|---|---|---|---|
| 19 | ODPA | 1 | TEG | 50 | TEGE | 45 |
| 20 | ODPA•HTMA | 800 | TEG | 70 | DEGE | 29 |

Here, in Tables, HPA stands for n-hexylphosphonic acid; OPA stands for n-octylphosphonic acid; DPA stands for n-decylphosphonic acid; DDPA stands for n-dodecylphosphonic acid; TDPA stands for n-tetradecylphosphonic acid; HDPA stands for n-hexadecylphosphonic acid; and ODPA stands for n-octadecylphosphonic acid.

Further, in Tables, TMA stands for tetramethylammonium and HTMA stands for 2-hydroxyethyl-N,N,N-trimethylammonium.

Furthermore, in Tables, DEG stands for diethylene glycol; PG stands for propylene glycol; DEGM stands for diethylene glycol monomethyl ether; DPG stands for dipropylene glycol; TEG stands for triethylene glycol; DEGB stands for diethylene glycol monobutyl ether; DEGE stands for diethylene glycol monoethyl ether; TEGB stands for triethylene glycol monobutyl ether; TPG stands for tripropylene glycol; PGE stands for propylene glycol monoethyl ether; DPGM stands for dipropylene glycol monomethyl ether; TEGM stands for triethylene glycol monomethyl ether; and TEGE stands for triethylene glycol monoethyl ether.

Examples 1 to 20

As shown in FIG. 1A, silicon nitride 103 (thickness: 100 nm) and silicon oxide 102 (thickness: 1,200 nm) were formed as films on a silicon substrate 104, then a photoresist 101 was formed. The photoresist 101 was then exposed and developed to form a circular and ring-shaped opening 105 (diameter: 125 nm, distance between circles: 50 nm), as shown in FIG. 1B. The silicon oxide 102 with the photoresist 101 as a mask was dry-etched to form a cylindrical hole 106 reaching a layer of silicon nitride 103, as shown in FIG. 1C. The photoresist 101 was then removed by ashing to yield a structure with the silicon oxide 102 which the cylindrical hole 106 reaching the layer of silicon nitride 103 was dug in, as shown in FIG. 1D. The cylindrical hole 106 of the resulting structure was filled and deposited with titanium nitride as metal 107 (FIG. 1E). Then, an excessive portion of metal (titanium nitride) 107 was removed by chemical mechanical polishing (CMP) to yield a structure with the silicon oxide 102 in which a cylindrical hollow of metal (titanium nitride) 108 was embedded, as shown in FIG. 1F. The resulting structure was treated with a 0.5% aqueous hydrofluoric acid solution (by dipping at 25° C., for 1 minute) to dissolve and remove the silicon oxide 102, and then sequentially rinsed with pure water, each of Treatment Liquids 1 to 20 (by dipping at 70° C., for 10 minutes) and pure water, and dried, thereby yielding a structure shown in FIG. 1G. Further, an appearance of liquid was confirmed by putting the treatment liquid in a glass bottle and then shining a flashlight on the bottle. If the liquid was non-homogenous, a white turbidity was seen in the appearance. In case where the white turbidity was seen, a substrate was not treated (as described below, Comparative Liquids 4, 6 and 9 were non-homogenous and were not used in the treatment).

The resulting structure had a fine structure with a cylinder pattern comprising cylinder hollows of metal (titanium nitride) (diameter: 125 nm, height: 1,200 nm (aspect ratio: 9.6), distance between the cylinder hollows: 50 nm), and 70% or more of the pattern was not collapsed.

The pattern collapse was observed with "FE-SEM S-5500 (model number)", produced by Hitachi High-Technologies Corporation, and the collapse inhibition ratio was a value obtained by calculating the ratio of the number of cylinder hollows not collapsed in pattern to the total number of cylinder hollows in pattern. Cases where the collapse inhibition ratio was 50% or more were determined as "pass". The treatment liquids, the treatment methods and the results of collapse inhibition ratios in Examples are shown in Table 3.

Comparative Example 1

A structure shown in FIG. 1G was obtained in the same manner as in Example 1 except that the structure shown in FIG. 1F was treated with a 0.5% aqueous hydrofluoric acid solution to dissolve and remove the silicon oxide 102 thereof, and then rinsed with only pure water. 50% or more of the pattern of the resulting structure was collapsed as shown in FIG. 1H (that is, a collapse inhibition ratio becomes less than 50%). The treatment liquid, the treatment method and the result of collapse inhibition ratio in Comparative Example 1 are shown in Table 3.

Comparative Examples 2 to 9

A structure shown in FIG. 1G was obtained in the same manner as in Example 1 except that the structure shown in FIG. 1F was treated with a 0.5% aqueous hydrofluoric acid solution to dissolve and remove the silicon oxide 102 thereof, and then rinsed with each of Comparative Liquids 1 to 9 instead of the Treatment Liquid 1. 50% or more of the pattern of the resulting structure was collapsed as shown in FIG. 1H (that is, a collapse inhibition ratio becomes less than 50%). The treatment liquids, the treatment methods and the results of collapse inhibition ratio in Comparative Examples 2 to 9 are shown in Table 3. Here, in Comparative Examples 4, 6 and 9, Appearance of Liquid in each of Comparative Liquids 4, 6 and 9 was non-homogenous, thus they were not used in the treatment.

TABLE 2

| Comparativ Liquid No. | Reagent | Content (ppm) | Solvent | Content[X.1] (%) |
|---|---|---|---|---|
| 1 | — | — | water | 100 |
| 2 | — | — | isopropyl alcohol | 100 |
| 3 | — | — | PG | 100 |
| 4 | DDPA | 30 | — | — |
| 5 | DPA | 100 | PG | 99.99 |
| 6 | DPA | 100 | PG | 50 |
| 7 | Butylphosphonic acid | 1000 | DEG | 95 |
| 8 | Octylamine | 200 | — | — |
| 9 | DDPA | 20 | PGMEA[X.2] | 9.998 |

[X.1] The deficit of the content up to 100% by weight was compensated by supplying water.
[X.2] PGMEA stands for Proplylene Glycol Monomethylether Acetate.

TABLE 3

|  |  | Appearance of Liquid | Treatment Method | Collapse Inhibition Ratio※1 | Decision to pass or fail |
|---|---|---|---|---|---|
| Example | 1 | homogenous | pure water→treatment liquid 1→pure water→dry | 70% or more | pass |
|  | 2 | homogenous | pure water→treatment liquid 2→pure water→dry | 70% or more | pass |
|  | 3 | homogenous | pure water→treatment liquid 3→pure water→dry | 70% or more | pass |
|  | 4 | homogenous | pure water→treatment liquid 4→pure water→dry | 80% or more | pass |
|  | 5 | homogenous | pure water→treatment liquid 5→pure water→dry | 80% or more | pass |
|  | 6 | homogenous | pure water→treatment liquid 6→pure water→dry | 90% or more | pass |
|  | 7 | homogenous | pure water→treatment liquid 7→pure water→dry | 90% or more | pass |
|  | 8 | homogenous | pure water→treatment liquid 8→pure water→dry | 90% or more | pass |
|  | 9 | homogenous | pure water→treatment liquid 9→pure water→dry | 90% or more | pass |
|  | 10 | homogenous | pure water→treatment liquid 10→pure water→dry | 90% or more | pass |
|  | 11 | homogenous | pure water→treatment liquid 11→pure water→dry | 90% or more | pass |
|  | 12 | homogenous | pure water→treatment liquid 12→pure water→dry | 90% or more | pass |
|  | 13 | homogenous | pure water→treatment liquid 13→pure water→dry | 90% or more | pass |
|  | 14 | homogenous | pure water→treatment liquid 14→pure water→dry | 90% or more | pass |
|  | 15 | homogenous | pure water→treatment liquid 15→pure water→dry | 90% or more | pass |
|  | 16 | homogenous | pure water→treatment liquid 16→pure water→dry | 90% or more | pass |
|  | 17 | homogenous | pure water→treatment liquid 17→pure water→dry | 90% or more | pass |
|  | 18 | homogenous | pure water→treatment liquid 18→pure water→dry | 90% or more | pass |
|  | 19 | homogenous | pure water→treatment liquid 19→pure water→dry | 80% or more | pass |
|  | 20 | homogenous | pure water→treatment liquid 20→pure water→dry | 80% or more | pass |
| Comparative Example | 1 | homogenous | pure water→dry | less than 50% | fail |
|  | 2 | homogenous | pure water→comparative liquid 2→pure water→dry | less than 50% | fail |
|  | 3 | homogenous | pure water→comparative liquid 3→pure water→dry | less than 50% | fail |
|  | 4 | non-homogenous | — | — | — |
|  | 5 | homogenous | pure water→comparative liquid 5→pure water→dry | less than 50% | fail |
|  | 6 | non-homogenous | — | — | — |
|  | 7 | homogenous | pure water→comparative liquid 7→pure water→dry | less than 50% | fail |
|  | 8 | homogenous | pure water→comparative liquid 8→pure water→dry | less than 50% | fail |
|  | 9 | non-homogenous | — | — | — |

※1 [Collapse Inhibition Ratio] = ([number of cylinder hollows not collapsed]/[total number of cylinder hollows]) × 100 [%]

Examples 21 to 40

A structure shown in FIG. 1G was obtained in the same manner as in each of Examples 1 to 20 except that tantalum was used instead of titanium nitride as metal 107 in each of Examples 1 to 20. The resulting structure had a fine structure with a cylinder pattern comprising cylinder hollows of metal (tantalum) 108 (diameter: 125 nm, height: 1,200 nm (aspect ratio: 9.6), distance between the cylinder hollows: 50 nm), and 60% or more of the pattern was not collapsed. The treatment liquids, the treatment methods and the results of collapse inhibition ratio in each Example are shown in Table 4.

Comparative Examples 10 to 18

A structure shown in FIG. 1G was obtained in the same manner as in each of Comparative Examples 1 to 9 except that tantalum was used instead of titanium nitride as metal 107 in Comparative Examples 1 to 9. 50% or more of the pattern of the resulting structure was collapsed as shown in FIG. 1H. The treatment liquids, the treatment methods and the results of collapse inhibition ratio in each Comparative Example are shown in Table 4. Here, in Comparative Examples 13, 15 and 18, Appearance of Liquid in each of Comparative Liquids 4, 6 and 9 was non-homogenous, thus they were not used in the treatment.

TABLE 4

|  |  | Appearance of Liquid | Treatment Method | Collapse Inhibition Ratio※1 | Decision to pass or fail |
|---|---|---|---|---|---|
| Example | 21 | homogenous | pure water→treatment liquid 1→pure water→dry | 70% or more | pass |
|  | 22 | homogenous | pure water→treatment liquid 2→pure water→dry | 60% or more | pass |
|  | 23 | homogenous | pure water→treatment liquid 3→pure water→dry | 70% or more | pass |
|  | 24 | homogenous | pure water→treatment liquid 4→pure water→dry | 80% or more | pass |
|  | 25 | homogenous | pure water→treatment liquid 5→pure water→dry | 80% or more | pass |
|  | 26 | homogenous | pure water→treatment liquid 6→pure water→dry | 90% or more | pass |
|  | 27 | homogenous | pure water→treatment liquid 7→pure water→dry | 90% or more | pass |
|  | 28 | homogenous | pure water→treatment liquid 8→pure water→dry | 90% or more | pass |
|  | 29 | homogenous | pure water→treatment liquid 9→pure water→dry | 90% or more | pass |
|  | 30 | homogenous | pure water→treatment liquid 10→pure water→dry | 90% or more | pass |
|  | 31 | homogenous | pure water→treatment liquid 11→pure water→dry | 90% or more | pass |
|  | 32 | homogenous | pure water→treatment liquid 12→pure water→dry | 90% or more | pass |
|  | 33 | homogenous | pure water→treatment liquid 13→pure water→dry | 90% or more | pass |
|  | 34 | homogenous | pure water→treatment liquid 14→pure water→dry | 90% or more | pass |
|  | 35 | homogenous | pure water→treatment liquid 15→pure water→dry | 90% or more | pass |
|  | 36 | homogenous | pure water→treatment liquid 16→pure water→dry | 90% or more | pass |
|  | 37 | homogenous | pure water→treatment liquid 17→pure water→dry | 90% or more | pass |
|  | 38 | homogenous | pure water→treatment liquid 18→pure water→dry | 90% or more | pass |
|  | 39 | homogenous | pure water→treatment liquid 19→pure water→dry | 70% or more | pass |
|  | 40 | homogenous | pure water→treatment liquid 20→pure water→dry | 80% or more | pass |
| Comparative Example | 10 | homogenous | pure water→dry | less than 50% | fail |
|  | 11 | homogenous | pure water→comparative liquid 2→pure water→dry | less than 50% | fail |

TABLE 4-continued

| | Appearance of Liquid | Treatment Method | Collapse Inhibition Ratio※1 | Decision to pass or fail |
|---|---|---|---|---|
| 12 | homogenous | pure water→comparative liquid 3→pure water→dry | less than 50% | fail |
| 13 | non-homogenous | — | — | — |
| 14 | homogenous | pure water→comparative liquid 5→pure water→dry | less than 50% | fail |
| 15 | non-homogenous | — | — | — |
| 16 | homogenous | pure water→comparative liquid 7→pure water→dry | less than 50% | fail |
| 17 | homogenous | pure water→comparative liquid 8→pure water→dry | less than 50% | fail |
| 18 | non-homogenous | — | — | — |

※1 [Collapse Inhibition Ratio] = ([number of cylinder hollows not collapsed]/[total number of cylinder hollows]) × 100 [%]

Examples 41 to 60

A structure shown in FIG. 1G was obtained in the same manner as in each of Examples 1 to 20 except that aluminum was used instead of titanium nitride as metal 107 in each of Examples 1 to 20. The resulting structure had a fine structure with a cylinder pattern comprising cylinder hollows of metal (aluminum) 108 (diameter: 125 nm, height: 1,200 nm (aspect ratio: 9.6), distance between the cylinder hollows: 50 nm), and 70% or more of the pattern was not collapsed. The treatment liquids, the treatment methods and the results of collapse inhibition ratio in each Example are shown in Table 5.

Comparative Examples 19 to 27

A structure shown in FIG. 1G was obtained in the same manner as in each of Comparative Examples 1 to 9 except that aluminum was used instead of titanium nitride as metal 107 in Comparative Examples 1 to 9. 50% or more of the pattern of the resulting structure was collapsed as shown in FIG. 1H. The treatment liquids, the treatment methods and the results of collapse inhibition ratio in each Comparative Example are shown in Table 5. Here, in Comparative Examples 22, 24 and 27, Appearance of Liquid in each of Comparative Liquids 4, 6 and 9 was non-homogenous, thus they were not used in the treatment.

TABLE 5

| | | Appearance of Liquid | Treatment Method | Collapse Inhibition Ratio※1 | Decision to pass or fail |
|---|---|---|---|---|---|
| Example | 41 | homogenous | pure water→treatment liquid 1→pure water→dry | 70% or more | pass |
| | 42 | homogenous | pure water→treatment liquid 2→pure water→dry | 70% or more | pass |
| | 43 | homogenous | pure water→treatment liquid 3→pure water→dry | 70% or more | pass |
| | 44 | homogenous | pure water→treatment liquid 4→pure water→dry | 80% or more | pass |
| | 45 | homogenous | pure water→treatment liquid 5→pure water→dry | 80% or more | pass |
| | 46 | homogenous | pure water→treatment liquid 6→pure water→dry | 90% or more | pass |
| | 47 | homogenous | pure water→treatment liquid 7→pure water→dry | 90% or more | pass |
| | 48 | homogenous | pure water→treatment liquid 8→pure water→dry | 90% or more | pass |
| | 49 | homogenous | pure water→treatment liquid 9→pure water→dry | 90% or more | pass |
| | 50 | homogenous | pure water→treatment liquid 10→pure water→dry | 90% or more | pass |
| | 51 | homogenous | pure water→treatment liquid 11→pure water→dry | 90% or more | pass |
| | 52 | homogenous | pure water→treatment liquid 12→pure water→dry | 90% or more | pass |
| | 53 | homogenous | pure water→treatment liquid 13→pure water→dry | 90% or more | pass |
| | 54 | homogenous | pure water→treatment liquid 14→pure water→dry | 90% or more | pass |
| | 55 | homogenous | pure water→treatment liquid 15→pure water→dry | 90% or more | pass |
| | 56 | homogenous | pure water→treatment liquid 16→pure water→dry | 90% or more | pass |
| | 57 | homogenous | pure water→treatment liquid 17→pure water→dry | 90% or more | pass |
| | 58 | homogenous | pure water→treatment liquid 18→pure water→dry | 90% or more | pass |
| | 59 | homogenous | pure water→treatment liquid 19→pure water→dry | 80% or more | pass |
| | 60 | homogenous | pure water→treatment liquid 20→pure water→dry | 80% or more | pass |
| Comparative Example | 19 | homogenous | pure water→dry | less than 50% | fail |
| | 20 | homogenous | pure water→comparative liquid 2→pure water→dry | less than 50% | fail |
| | 21 | homogenous | pure water→comparative liquid 3→pure water→dry | less than 50% | fail |
| | 22 | non-homogenous | — | — | — |
| | 23 | homogenous | pure water→comparative liquid 5→pure water→dry | less than 50% | fail |
| | 24 | non-homogenous | — | — | — |
| | 25 | homogenous | pure water→comparative liquid 7→pure water→dry | less than 50% | fail |
| | 26 | homogenous | pure water→comparative liquid 8→pure water→dry | less than 50% | fail |
| | 27 | non-homogenous | — | — | — |

※1 [Collapse Inhibition Ratio] = ([number of cylinder hollows not collapsed]/[total number of cylinder hollows]) × 100 [%]

Industrial Applicability

The treatment liquid of the present invention can be used favorably for inhibiting pattern collapse in manufacturing a metal microstructure such as a semiconductor device and a micromachine (MEMS).

DESCRIPTION OF SYMBOLS

101: photoresist
102: silicon oxide
103: silicon nitride
104: silicon substrate
105: circular opening
106: cylindrical hole
107: metal (titanium nitride, tantalum or aluminum)
108: cylinder hollow of metal (titanium nitride, tantalum or aluminum)

The invention claimed is:

1. A treatment liquid for inhibiting pattern collapse in a metal microstructure comprising an alkylphosphonic acid or salt thereof in which said alkyl moiety contains 10 to 16 carbon atoms; water; and a glycol of the following formula (1) or (2):

$$HO(C_2H_4O)_n R^1 \quad (1)$$

$$HO(C_3H_6O)_m R^1 \quad (2)$$

wherein $R^1$ denotes a hydrogen atom or a $C_1$-$C_4$ alkyl group, n denotes an integer of 2 to 4, and m denotes an integer of 1 to 3;

wherein the content of the alkylphosphonic acid is 5 ppm to 800 ppm.

2. The treatment liquid for inhibiting pattern collapse according to claim 1, wherein the microstructure contains at least one metal selected from among titanium, tantalum and aluminum.

3. A method of manufacturing a microstructure containing at least one metal selected from among titanium, tantalum and aluminum and having an aspect ratio of 5 or more, the method comprising:

in rinsing steps following wet-etching or dry-etching, using a treatment liquid for inhibiting pattern collapse in a metal microstructure comprising an alkylphosphonic acid or salt thereof in which said alkyl moiety contains 10 to 16 carbon atoms; water; and a glycol of the following formula (1) or (2):

$$HO(C_2H_4O)_n R^1 \quad (1)$$

$$HO(C_3H_6O)_m R^1 \quad (2)$$

wherein $R^1$ denotes a hydrogen atom or a $C_1$-$C_4$ alkyl group, n denotes an integer of 2 to 4, and m denotes an integer of 1 to 3;

wherein the content of the alkylphosphonic acid is 5 ppm to 800 ppm.

4. The method of manufacturing a microstructure according to claim 3, wherein the microstructure containing at least one metal selected from among titanium, tantalum and aluminum is a semiconductor device or a micromachine.

5. The method of manufacturing a microstructure according to claim 3, wherein the microstructure has an aspect ratio of 9 or more.

6. The method of manufacturing a microstructure according to claim 3, wherein the content of glycols is 60% by weight to 99% by weight.

7. The method of manufacturing a microstructure according to claim 3, wherein the content of glycols is 60% by weight to 95% by weight.

8. The treatment liquid for inhibiting pattern collapse according to claim 1, wherein the metal microstructure has an aspect ratio of 5 or more.

9. The treatment liquid for inhibiting pattern collapse according to claim 1, wherein the metal microstructure has an aspect ratio of 9 or more.

10. The treatment liquid for inhibiting pattern collapse according to claim 1, wherein the content of glycols is 60% by weight to 95% by weight.

11. The treatment liquid for inhibiting pattern collapse according to claim 1, wherein the content of glycols is 60% by weight to 99% by weight.

* * * * *